US012693694B2

(12) United States Patent     (10) Patent No.:     US 12,693,694 B2
    Chiang                        (45) Date of Patent:          Jul. 28, 2026

(54) CONTROLLING SYSTEM IN VOLTAGE CHIP AND SERVER

(71) Applicant: Fulian Precision Electronics (Tianjin) Co., LTD., Tianjin (CN)

(72) Inventor: Chen-En Chiang, New Taipei (TW)

(73) Assignee: Fulian Precision Electronics (Tianjin) Co., LTD., Tianjin (CN)

( * ) Notice:   Subject to any disclaimer, the term of this patent is extended or adjusted under 35 U.S.C. 154(b) by 0 days.

(21) Appl. No.: 18/828,767

(22) Filed:      Sep. 9, 2024

(65)            Prior Publication Data

US 2025/0334983 A1      Oct. 30, 2025

(30)        Foreign Application Priority Data

Apr. 28, 2024    (CN) .......................... 202410523593.3

(51) Int. Cl.
     *H03K 19/00*          (2006.01)
     *G05F 1/46*           (2006.01)
     *H03K 19/173*         (2006.01)
(52) U.S. Cl.
     CPC ............. *G05F 1/46* (2013.01); *H03K 19/173* (2013.01)
(58) Field of Classification Search
     CPC .. H02M 1/0045; H02M 1/0012; H02M 3/157; G05F 1/46; G05F 1/56; G05F 1/575
     See application file for complete search history.

(56)            References Cited

U.S. PATENT DOCUMENTS 7,688,053 B2 *   3/2010   Tung ..................... H02M 3/156
                                                      323/283
    2010/0271114 A1 * 10/2010  Wang ........................ G05F 1/46
                                                      327/540

FOREIGN PATENT DOCUMENTS

CN           114415566 A      4/2022

* cited by examiner

*Primary Examiner* — Tuan T Lam

(74) *Attorney, Agent, or Firm* — ScienBiziP, P.C.

(57)            ABSTRACT

A controlling system in a voltage chip includes a controlling circuit and a conversion circuit. The controlling circuit is electrically connected with the voltage chip. The controlling circuit receive a voltage regulating instruction and generates a target level signal based on the voltage regulating instruction and the current supply voltage outputted by the voltage chip. The conversion circuit is electrically connected with the controlling circuit and the voltage chip. The conversion circuit receives the target level signal, converts the target level signal into a corresponding voltage level signal, and outputs the voltage level signal to the voltage chip. The voltage level signal controls the supply voltage outputted by the voltage chip. A server is also provided.

17 Claims, 6 Drawing Sheets

CONTROLLING SYSTEM IN VOLTAGE CHIP AND SERVER

TECHNICAL FIELD

The present application generally relates to server technology, and particularly to a controlling system in a voltage chip and a server.

BACKGROUND

A printed circuit board (PCB) of a server includes a voltage chip. The voltage chip converts a power voltage into a supply voltage required of a target electronic component, thus the PCB powers the target electronic component in the PCB.

A division resistor is electrically connected between a feedback pin and a supply voltage outputting pin of the voltage chip. A regulation bypass circuit is formed by the division resistor, the feedback pin, and the supply voltage outputting pin. A level signal with a fixed voltage is provided to the feedback pin, which is generated based on the supply voltage being divided by the division resistor. Therefore, the voltage chip converts the power voltage into the supply voltage with a fixed voltage based on the level signal.

After the voltage chip is soldered on the PCB, the supply voltage is unable to adjust. When the supply voltage needs to be adjusted, a new division resistor with a different resistance is required to replace the soldered division resistor on the PCB. Further, while the division resistor aging, the resistance of the division resistor changes, the supply voltage changes accordingly. An effective of powering the target electronic component is impacted, and a normal operation of the server is also being impacted. There is room for improvement in the art.

BRIEF DESCRIPTION OF THE DRAWINGS

Implementations of the present application will now be described, by way of example only, with reference to the attached figures.

DETAILED DESCRIPTION

Figure 1:
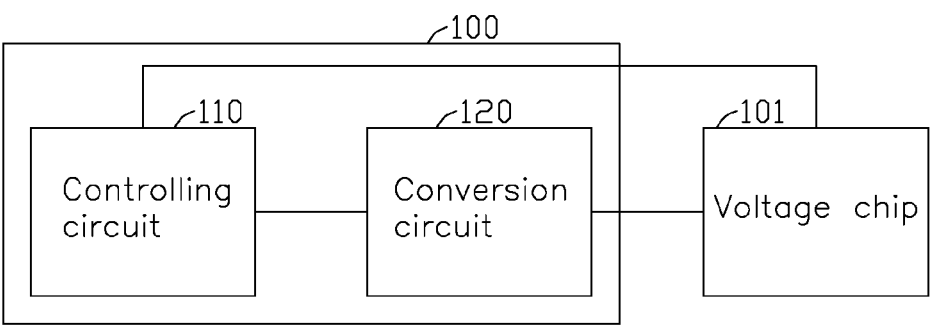
FIG. 1 is a diagram illustrating a first embodiment of a controlling system according to the present application.

The technical solutions in the embodiments of the present application will be clearly and completely described below which combine with reference to the accompanying drawings in the embodiments of the present application. Apparently, the described embodiments are some of the embodiments of the present application rather than all of the embodiments. Based on the embodiments of the present application, it is understandable to a person skilled in the art, any other embodiments obtained by persons skilled in the art without creative effort shall all fall into the scope of the present application. It will be understood that the specific embodiments described herein are merely some embodiments and not all.

In general, the word "module," as used herein, refers to logic embodied in hardware or firmware, or to a collection of software instructions, written in a programming language, for example, Java, C, or assembly. One or more software instructions in the modules may be embedded in firmware, such as an EPROM, magnetic, or optical drives. It will be appreciated that modules may comprise connected logic units, such as gates and flip-flops, and may comprise programmable units, such as programmable gate arrays or processors, such as a CPU. The modules described herein may be implemented as either software and/or hardware modules and may be stored in any type of computer-readable medium or other computer storage systems. The term "comprising" means "including, but not necessarily limited to"; it specifically indicates open-ended inclusion or membership in a so-described combination, group, series, and the like. The application is illustrated by way of example and not by way of limitation in the figures of the accompanying drawings in which like references indicate similar elements. It should be noted that references to "an" or "one" embodiment in this application are not necessarily to the same embodiment, and such references can mean "at least one."

It should be understood that, terms "at least one" means one or more than one, the term "multiple" means two ore more than two. The term "and/or" is used to describe an association relationship for describing associated objects, and indicates that three relationships may exist. For example, "A and/or B" may represent the following three cases: Only A exists, only B exists, and both A and B exist, where A and B may be singular or plural. In the description of the present application, terms "first", "second", "third", "fourth", and the like used in the specification, the claims, and the accompanying drawings of the present application are used to distinguish between same items or different objects, and do not constitute any limitation on a quantity and an execution order, and the terms "first" and "second" do not mean being definitely different either.

It should be understood that, the method of the present application or the method shown in the flowchart of the present application comprises one or more steps for achieving the method, and the method steps may be interchanged with one another without departing from the scope of the claims, and some of the steps also may be deleted.

A printed circuit board (PCB) of a server includes a voltage chip. The voltage chip converts a power voltage into a supply voltage required of a target electronic component, thus the PCB powers the target electronic component in the PCB.

A division resistor is electrically connected between a feedback pin and a supply voltage outputting pin of the voltage chip. A regulation bypass circuit is formed by the division resistor, the feedback pin, and the supply voltage outputting pin. A level signal with a fixed voltage is provided to the feedback pin, which is generated based on the supply voltage being divided by the division resistor. Therefore, the voltage chip converts the power voltage into the supply voltage with a fixed voltage based on the level signal.

After the voltage chip is soldered on the PCB, the supply voltage is unable to adjust. When the supply voltage needs to be adjusted, a new division resistor with a different resistance is required to replace the soldered division resistor on the PCB. Further, while the division resistor aging, the resistance of the division resistor changes, the supply voltage changes accordingly. An effective of powering the target electronic component is impacted, and a normal operation of the server is also being impacted.

The present application provides a controlling system in a voltage chip and a server, which are configured to adjust the supply voltage outputted by the voltage chip, thus the change of the supply voltage of the voltage chip is avoided, and the operation of the server is ensured to be stable.

Referring to FIG. 1, FIG. 1 illustrates an embodiment of the controlling system 100 with a voltage chip of the present application. The controlling system 100 includes a controlling circuit 110 and a conversion circuit 120.

In one embodiment, the controlling circuit 110 is electrically connected with the voltage chip 101. The controlling circuit 110 is configured to receive a voltage regulating instruction, and generate a target level signal based on the voltage regulating instruction and the current supply voltage outputted by the voltage chip 101. The conversion circuit 120 is electrically connected with controlling circuit 110 and the voltage circuit 101. The conversion circuit 120 is configured to receive the target level signal, convert the target level signal into a corresponding voltage level signal, and output the voltage level signal to the voltage chip 101. The voltage level signal is configured to control the supply voltage outputted by the voltage chip 101.

It is understood that, the controlling system 100 of the present application includes the controlling circuit 110 and the conversion circuit 120. By receiving the voltage regulating instruction by the controlling circuit 110, the target voltage level signal is generated based on the voltage regulating instruction and the current supply voltage outputted by the voltage chip 101. The target voltage level signal is converted into the corresponding voltage level signal by the conversion circuit 120, for regulating the voltage level signal. Thus, the supply voltage outputted by the voltage chip 101 is adjustable when being different from a target supply voltage, for avoiding the supply voltage outputted by the voltage chip 101 to be changed.

Figure 2:
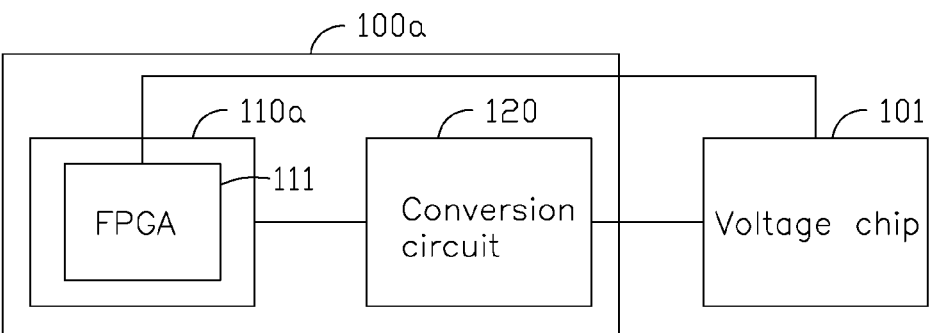
FIG. 2 is a diagram illustrating a second embodiment of the controlling system of FIG. 1 according to the present application.

Referring to FIG. 2, FIG. 2 illustrates a second embodiment of the controlling system 100a with the voltage chip of the present application. By comparing with the controlling system 100, the difference between the controlling system 100 and the controlling system 100a is the controlling circuit 110a with a field programmable logic gate array (FPGA) 111.

In the embodiment, the target level signal includes a pulse modulation signal (PWM). The FPGA 111 is configured to obtain a voltage deviation between a target voltage corresponding to the voltage regulating instruction and the current supply voltage and generate a PWM corresponding to the voltage deviation.

It is understood that, in one embodiment, using the FPGA 111 in the server as the controlling circuit 110a, a cost of the controlling circuit 100a is reduced, and there is no additional component added in the server to form the controlling circuit 110a.

Figure 3:
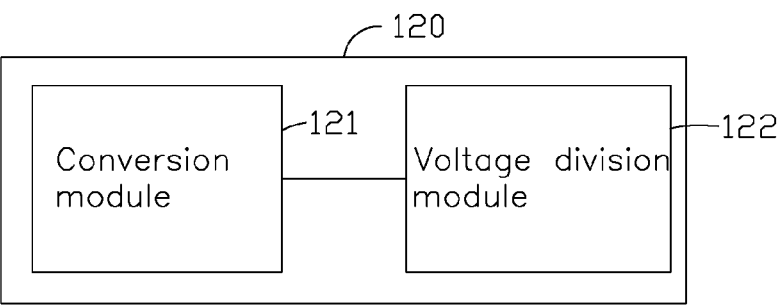
FIG. 3 is a diagram illustrating an embodiment of a conversion circuit of FIG. 1 according to the present application.

Referring to FIG. 3, FIG. 3 illustrates the conversion circuit 120 of the present application. The conversion circuit 120 includes a conversion module 121 and a voltage division module 122.

In one embodiment, the conversion module 121 is configured to receive the target level signal and convert the target level signal into the corresponding voltage signal. When the target level signal is the PWM, the PWM is converted into the voltage signal. The voltage division module 122 is configured to divide the target level signal at a specified ratio, generate, and output the voltage level signal.

Figure 4:
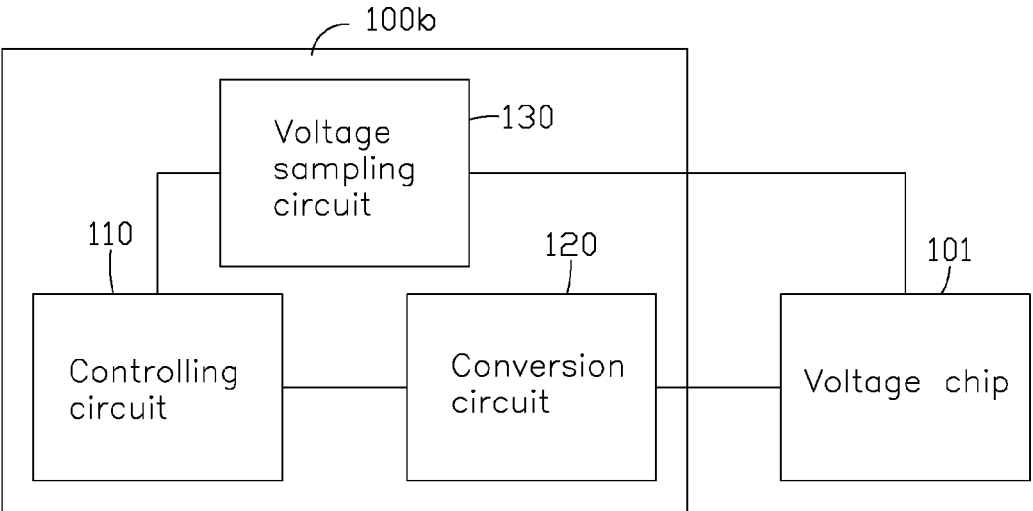
FIG. 4 is a diagram illustrating a third embodiment of the controlling system of FIG. 1 according to the present application.

Referring to FIG. 4, FIG. 4 illustrates a third embodiment of the controlling system 100b with the voltage chip 101. By comparing with the controlling system 100b and the foregoing controlling system 100, the difference is that the controlling system 100b also includes a voltage sampling circuit 130.

In one embodiment, the voltage sampling circuit 130 is electrically connected with a voltage outputting pin of the voltage chip 101. The voltage sampling circuit 130 is configured to obtain the current supply voltage and transmit to the controlling circuit 110.

Figure 5:
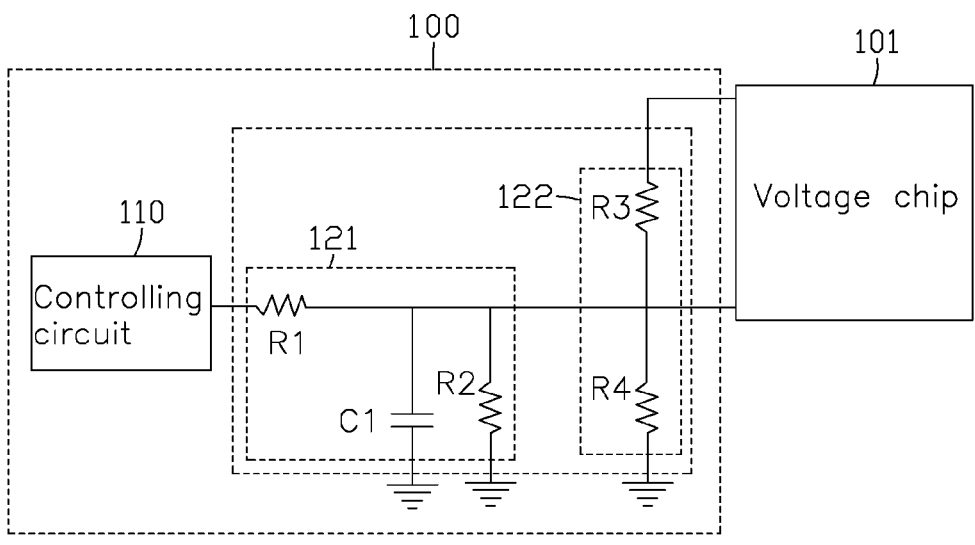
FIG. 5 is a circuit diagram illustrating of an embodiment of the controlling system of FIG. 1 according to the present application.

Referring to FIG. 5, FIG. 5 illustrates a circuit diagram of the controlling system 100 with the voltage chip 101.

In one embodiment, the controlling system 100 includes the controlling circuit 110 and the conversion circuit 120. The controlling circuit 110 is electrically connected with the voltage chip 101. The controlling circuit 110 is configured to receive the voltage regulating instruction, and generate the target level signal based on the voltage regulating instruction and the current supply voltage outputted by the voltage chip 101. The conversion circuit 120 is electrically connected with controlling circuit 110 and the voltage circuit 101. The conversion circuit 120 is configured to receive the target level signal, convert the target level signal into the corresponding voltage level signal, and output the voltage level signal to the voltage chip 101. The voltage level signal is configured to control the supply voltage outputted by the voltage chip 101.

The conversion circuit 120 includes the conversion module 121 and the voltage division module 122. The conversion module 121 includes a first resistor R1, a second resistor R2, and a capacitor C1. A first terminal of the first resistor R1 is electrically connected with the controlling circuit 110, and a second terminal of the first resistor R1 is electrically connected with the voltage division module 122. A first terminal of the second resistor R2 is electrically connected with the second terminal of the first resistor R1, and a second terminal of the second resistor R2 is grounded. A first terminal of the capacitor C1 is electrically connected with the second terminal of the first resistor R1, and a second terminal of the capacitor C1 is grounded.

The voltage division module 120 includes a third resistor R3 and a fourth resistor R4. A first terminal of the third resistor R3 is electrically connected with a feedback pin of the voltage chip 10 and the conversion module 121, and a second terminal of the third resistor R3 is electrically connected with an outputting pin of a comparator of the voltage chip 101. A first terminal of the fourth resistor R4 is electrically connected with the first terminal of the third resistor R3, and a second terminal of the fourth resistor R4 is grounded.

Figure 6:
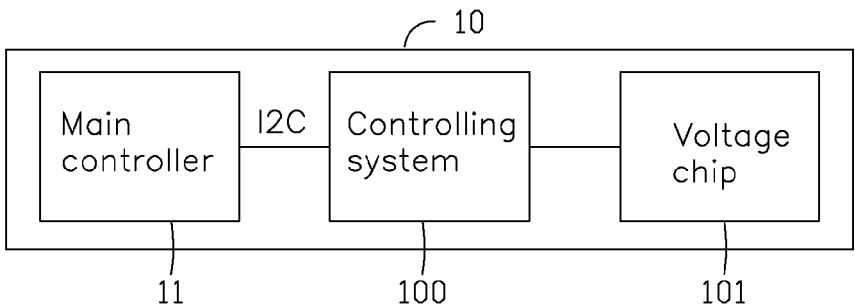
FIG. 6 is a diagram illustrating of a server according to the present application.

Referring to FIG. 6, FIG. 6 illustrates a server 10 of the present application. The server 10 includes the voltage chip 101 and the controlling system 100 of the above foregoing embodiments.

In one embodiment, the server 10 further includes a main controller 11. The main controller 11 is configured to receive the voltage regulating instruction from a remote device and transmit the voltage regulating instruction to the controlling system 100 by an Inter Integrated Circuit (I2C) bus.

It is understood that, the beneficial effect of the above server 10 may be found in the beneficial effect of the controlling system 100. Details will not be described herein again.

Those skilled in the art will recognize that the above described embodiments are only intended to illustrate the invention and are not intended to limit the invention, and numerous possible modifications and variations within the spirit of the invention will fall within the scope of the invention.

What is claimed is:

1. A controlling system in a voltage chip, the controlling system comprises:

a controlling circuit, electrically connected with the voltage chip, and configured to receive a voltage regulating instruction from a remote device and generate a target level signal based on the voltage regulating instruction and a supply voltage outputted by the voltage chip; and a conversion circuit, electrically connected with the controlling circuit and the voltage chip, and configured to receive the target level signal, convert the target level signal into a corresponding voltage level signal, and output the voltage level signal to the voltage chip, wherein the voltage level signal is configured to control the voltage chip to output a target voltage.

2. The controlling system of claim 1, wherein the controlling circuit comprises a field programmable logic gate array (FPGA).

3. The controlling system of claim 2, wherein the FPGA is configured to obtain the voltage deviation between the target voltage corresponding to the voltage regulating instruction and the supply voltage and generate a PWM as the target level signal based on the voltage deviation.

4. The controlling system of claim 2, wherein the FPGA receives the voltage regulating instructions using an Inter Integrated Circuit (I2C) bus.

5. The controlling system of claim 1, wherein the conversion circuit comprises:

a conversion module, configured to receive the target level signal and convert the target level signal into a corresponding voltage level signal; and a voltage division module, configured to divide the target level signal at a specified ratio, generate, and output the voltage level signal.

6. The controlling system of claim 5, wherein the conversion module further comprises a first resistor, a second resistor, and a capacitor; a first terminal of the first resistor is electrically connected with the controlling circuit, and a second terminal of the first resistor is electrically connected with the voltage division module; a first terminal of the second resistor is electrically connected with the second terminal of the first resistor, and a second terminal of the second resistor is grounded; a first terminal of the capacitor is electrically connected with the second terminal of the first resistor, and a second terminal of the capacitor is grounded.

7. The controlling system of claim 5, wherein the voltage division module comprises a third resistor and a fourth resistor; a first terminal of the third resistor is electrically connected with a feedback pin of the voltage chip and the conversion module, and a second terminal of the third resistor is electrically connected with an outputting pin of a comparator of the voltage chip; a first terminal of the fourth resistor is electrically connected with the first terminal of the third resistor, and a second terminal of the fourth resistor is grounded.

8. The controlling system of claim 1, further comprising:

a voltage sampling circuit, electrically connected with a voltage outputting pin of the voltage chip and configured to obtain the supply voltage and transmit to the controlling circuit.

9. A server comprising:

a voltage chip; and a controlling system, the controlling system comprising:

a controlling circuit, electrically connected with the voltage chip, and configured to receive a voltage regulating instruction from a remote device and generate a target level signal based on the voltage regulating instruction and a supply voltage outputted by the voltage chip; and a conversion circuit, electrically connected with the controlling circuit and the voltage chip, and configured to receive the target level signal, convert the target level signal into a corresponding voltage level signal, and output the voltage level signal to the voltage chip, wherein the voltage level signal is configured to control the voltage chip to output a target voltage.

10. The server of claim 9, wherein the controlling circuit comprises a field programmable logic gate array (FPGA).

11. The server of claim 10, wherein the FPGA is configured to obtain a voltage deviation between the target voltage corresponding to the voltage regulating instruction and the supply voltage and generate a PWM as the target level signal based on the voltage deviation.

12. The server of claim 10, wherein the FPGA receives the voltage regulating instructions using an Inter Integrated Circuit (I2C) bus.

13. The server of claim 9, wherein the conversion circuit comprises:

a conversion module, configured to receive the target level signal and convert the target level signal into a corresponding voltage level signal; and a voltage division module, configured to divide the target level signal at a specified ratio, generate, and output the voltage level signal.

14. The server of claim 13, wherein the conversion module further comprises a first resistor, a second resistor, and a capacitor; a first terminal of the first resistor is electrically connected with the controlling circuit, and a second terminal of the first resistor is electrically connected with the voltage division module; a first terminal of the second resistor is electrically connected with the second terminal of the first resistor, and a second terminal of the second resistor is grounded; a first terminal of the capacitor is electrically connected with the second terminal of the first resistor, and a second terminal of the capacitor is grounded.

15. The server of claim 13, wherein the voltage division module comprises a third resistor and a fourth resistor; a first terminal of the third resistor is electrically connected with a feedback pin of the voltage chip and the conversion module, and a second terminal of the third resistor is electrically connected with an outputting pin of a comparator of the voltage chip; a first terminal of the fourth resistor is electrically connected with the first terminal of the third resistor, and a second terminal of the fourth resistor is grounded.

16. The server of claim 9, wherein the controlling system further comprises:

a voltage sampling circuit, electrically connected with a voltage outputting pin of the voltage chip and configured to obtain the supply voltage and transmit to the controlling circuit.

17. The server of claim 9, further comprising:

a main controller, configured to receive the voltage regulating instruction from a remote device and transmit the voltage regulating instruction to the controlling system by an Inter Integrated Circuit (I2C) bus.

* * * * *